US006320812B1

(12) United States Patent
Cook, III et al.

(10) Patent No.: US 6,320,812 B1
(45) Date of Patent: Nov. 20, 2001

(54) ERROR CATCH RAM FOR MEMORY TESTER HAS SDRAM MEMORY SETS CONFIGURABLE FOR SIZE AND SPEED

(75) Inventors: John H. Cook, III, Fort Collins, CO (US); Preet P. Singh, Freemont; Edmundo De la Puente, Cupertino, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/665,892

(22) Filed: Sep. 20, 2000

(51) Int. Cl.$^7$ ........................................................ G11C 8/00
(52) U.S. Cl. ........................................ 365/230.03; 365/233
(58) Field of Search ................................. 365/230.03, 233

(56) References Cited

U.S. PATENT DOCUMENTS

Re. 36,875 * 9/2000 Iwamoto et al. ...................... 365/201

* cited by examiner

Primary Examiner—David Nelms
Assistant Examiner—M. Tran
(74) Attorney, Agent, or Firm—Edward L. Miller

(57) ABSTRACT

DRAM speed of operation in an Error Catch RAM can be increased by a combination of interleaving signals for different Banks of memory in a Group thereof and multiplexing between those Groups of Banks. A three-way multiplexing between three Groups of four Banks each, combined with a flexible four-fold interleaving scheme for signals to a Group produces an increase in speed approaching a factor of twelve, while requiring only three memory busses. Each of the twelve Banks represents the entire available address space, and any individual write cycle might access any one of the twelve Banks. A utility mechanism composes results for all twelve Banks during a read cycle at an address into a unified result. There is a mechanism to track of the integrity of the composed results, as further write operations can produce the need for another composing step. There are four Memory Sets, two are "internal" SRAM's and two are "external" DRAM's. The SRAM's are integral parts of VLSI circuits, while the DRAM's are individual packaged parts adjacent that VLSI. The amount of DRAM is optional. For DRAM memory sets the multiplexing and interleaving mode allows full random access at speeds of up to 100 MHz. For speeds will not exceed 33 MHz, the DRAM's can be configured to provide three times the depth in return for the lower speed by removing the multiplexing between Groups in favor of just interleaving upon one larger Group; Bank enable bits that were used as part of the multiplexing can now be used as regular address bits to increase the size of the address space of the one Group that remains. If the testing to the DUT fits the "linear" mode of access, a twelve-fold increase in memory depth is available, even when the DUT is tested at the highest speed the tester can operate at. This eliminates the interleaving scheme in favor of addressing within a single Bank at a time. Another reconfiguration is to combine the external memory sets into one memory set that has twice the depth of either uncombined set, regardless of other (i.e., the speed related) modes of operation.

10 Claims, 10 Drawing Sheets

ERROR CATCH RAM FOR MEMORY TESTER HAS SDRAM MEMORY SETS CONFIGURABLE FOR SIZE AND SPEED

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory tester frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT (Device Under Test), and receive vectors that are expected in return (response). The algorithmic logic; that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is conventional to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

It was mentioned above that the DUT may well be susceptible of repair. This is often true even for undiced memory chips that are still part of a wafer. How this is actually achieved on the circuit level is well understood by those who manufacture such devices, so it is sufficient for us to simply say that incorporated into those devices are some number of selectably destroyable elements whose destruction enables gating that in turn alters the internal logic of an associated circuit. This ability is used to route internal signals to replacement circuits that substitute for defective ones. This capability cannot be economically worth while unless the repair can be made with less time and effort that would be required to make a new part; otherwise it would be more cost effective to simply jettison the bad part into the scrap barrel. In particular, it is undesirable to involve a human technician in the processes of understanding the particular failures in a stream of bad parts and of being responsible for deciding how to repair them. Instead, an algorithmic mechanism (program) in the memory tester can be developed to analyze the failure and attempt its repair. The repaired part can be re-tested on the spot, and its fate decided.

Such a mode of operation has certain implications for the design of the memory tester. Testing must be performed at whatever speeds are deemed suitable, which are often at the highest speeds that the part is intended to operate. Real time detection of failures can be used to set flags and alter test algorithms to refine the understanding of the failure. That is, tests performed to verify proper operation might not be the ones best suited to discover why the part is failing in the first place. Finally, the memory tester needs to be able to create a trace (that is, a usable record) of test data for an automated analysis (whether performed immediately or at the conclusion of a larger test process) that determines whether to attempt a repair, and if so, what actions to take in making the repair.

Typically, the attempt at repairs is postponed until after at least a preliminary testing reveals the scope or number of probable failures. The number of replacement circuits available is limited (say, half a dozen or so, as determined by an odds-driven cost benefit analysis), and there is no point in attempting to fix a part that can be shown to need more help than is available. If the testing of the DUT is to be performed at high speed and without unnecessary pauses, it is clear that the tester's memory used to create the trace describing the failures has to operate at the same high speeds used to test the DUT. In the memory tester to be described herein that memory is called the ECR (Error Catch RAM).

In operation an ECR is generally addressed by the same address that is applied to the DUT, and has a data word width in bits at least that of the DUT. The word width is adjustable along powers of two (eight, sixteen, thirty-two), with such adjustability accompanied by a corresponding inverse change in addressability, so that word width times the number of addressable locations equals some constant.

When a test channel for the DUT (a bit in an output word, or some other signal of interest) compares or fails to compare to expected results a corresponding bit at that address in the ECR is either set or cleared, according to the convention in use. As thus organized, the ECR has not got a multi-bit value for each address/channel combination, and can instead store just a single bit's worth of information for each such combination, no matter how many times that combination may be accessed during a test. Test strategy enters into what the bit means and how it is maintained. The bit might represent the dichotomy "it never failed/it failed at least once" for an entire multi-access test, or it might represent the outcome of the last access (i.e., test) only, even if that is at variance with earlier tests. If quantity information is desired about failures for a certain address/channel, some additional resource (a counter) must be allocated to record it.

Conventional memory testers have used SRAM for their ECR's. SRAM is accessed using a single unified address, and it is faster than DRAM when arbitrarily addressed, but is also considerably more expensive. The less expensive DRAM is internally organized to require the lengthy pre-charging of an addressed "row" with RAS (Row Address Strobe), followed by specifying an addressed "column" with CAS (Column Address Strobe). DRAM is often suitably fast if, once a row has been pre-charged, further addressing can be confined to columns along that row (i.e., further instances of CAS, but none of RAS). However, such an algorithmic restriction on tester operation (which interferes with the ability to arbitrarily address the DUT) is often unacceptable, and even though it is sometimes useful, it cannot be relied on to provide high speed ECR operation. It would be desirable if by using DRAM the size of the ECR could be both increased and its cost reduced, which benefits could be realized if there were a way to operate DRAM's with arbitrary addressing at the same rate as commonly expected of the more expensive SRAM's.

As a consumer of merchant parts, we have no way of making existing individual DRAM parts an order of magnitude or more faster. What we can do is employ more DRAM, up until the point where we are spending as much as we would for some desired amount of SRAM. This is attractive, since SRAM is considerably more expensive than DRAM. Multiplexing comes to mind, but an n-part multiplexing scheme produces an associated n-fold increase in the number of memory busses in use. At, say, fifty to sixty pins per bus, a ten-way multiplexer would be a certified nightmare just to realize the physical fan-out required. Furthermore, if we do find a way to put all that memory in a pile and write to it at high speed for use as an Error Catch RAM, we would also like to be able to easily reconfigure it for other uses, say where the random access speed is known to be lower, or where we wish to be able to both read and write at high speed using simple methods native to the parts and provided that the principal mode of addressing will be confined to changes in the column address. What to do?

SUMMARY OF THE INVENTION

The problem of increasing the speed of DRAM operation for use in an Error Catch RAM can be solved by a combination of interleaving signals for different Banks of memory in a Group thereof and multiplexing between those Groups of Banks. A three-way multiplexing between three Groups of four Banks each, combined with a flexible four-fold interleaving scheme for signal traffic to a Group produces an increase in operating speed approaching a factor of twelve, while requiring only three memory busses. A round robin strategy for choosing the next Group for the multiplexer is simple and assures that the interleaving mechanism for each Group has the time it needs to complete its most recently assigned task. Despite whether the next address within a Group is the same as, is adjacent or nearly so, or is far away from the previous address accessed within that Group, all interleaved accesses within a Group are performed upon a next Bank (within that Group), also selected by a simple round robin selection, rather than unnecessarily perform any real time high speed address analysis in an attempt to achieve within-Bank locality. In this configuration, each of the twelve Banks represents the entire available address space, and any individual write cycle might end up accessing any one of the twelve Banks. An implication is that, at the conclusion of testing, all twelve Banks must be investigated to learn what failures happened during testing of the DUT, since the history of any address or collection of addresses of interest will be spread out across all twelve Banks. That is, to determine which channels at an address passed or failed it is necessary to perform read operations to each of the twelve Banks (where in each Bank is determined by the address) and assess the meaning of the twelve collections of bits thus produced. A particular channel is thus represented by twelve bits (one bit from each Bank and whose bit position within the word for that Bank is determined by the channel).

It would be, however, awkward to have to (manually, as it were) individually consult all twelve Banks to discover failure information, so a utility mechanism has been provided to automatically "compose" (merge) results all twelve Banks during an ECR read cycle at an address into a unified result. That is, suppose that a zero in an address/channel combination represents failure to compare. Then, the $i^{th}$ bit of the composed result is a zero if and only if at least one of the twelve words (one from each of the twelve Banks) had an $i^{th}$ bit that was a zero. Composition occurs for all channels at once, but on an address by address basis. If desired, the composed result can then be stored for future reference into a selected Bank or perhaps simultaneously into all Banks. When included in a loop that performs this operation over an entire range of addresses that are of interest (say, the whole address space that was tested), this becomes a considerable convenience for subsequent failure analysis mechanisms. If the composed data were stored in all Banks then it can be read back in arbitrary order at full speed. There are also mechanisms to assist in keeping track of the integrity of the composed results, so that if further testing occurs (i.e., there is a write operation that is not simultaneously directed to all twelve Banks in unison) it will be possible to tell that another composing step is (almost certainly) needed. These mechanisms may involve registers that keep track of highest and lowest addresses that have been written to, assorted flags and operating system level information about which program "owns" a range of ECR address space, so that management of composition is flexible and may be minimal or extensive, as desired.

The ECR is also divided into four Memory Sets, two of which are "internal" SRAM's and two of which are "external" DRAM's. To be sure, all this memory is inside the memory tester; the terms "internal" and "external" have more to do with a level of integration. The SRAM's are integral parts of VLSI (Very Large Scale Integration) circuits associated with the ECR, while the DRAM's are individual packaged parts mounted adjacent the VLSI stuff. The amount of SRAM is fairly small, (say, around a megabit per memory set) while the amount of DRAM is substantial and selectable (say, in the range of 128 to 1024 megabits per memory set). The SRAM memory sets are always present, and may be used for any suitable purpose, such as storing the expected content of a DUT that is a ROM (Read Only Memory). The DRAM memory sets are actually optional, and are typically used for creating a trace for subsequent analysis leading to repair, although there are many other uses. The tester does not enforce a distinction between the SRAM and DRAM memory sets, as to different purposes for which they may be used. Those distinctions arise mostly as a matter of size. The SRAM memory sets are small, while the DRAM memory sets are large. The person or persons creating the test programming make the decisions concerning how the various memory sets are to be used. However, since SRAM already randomly addressable at high speed, it does not include the multiplexing/interleaving mechanism for multiple Banks; each SRAM memory set is simply a single Bank, as it were. As such, it is always composed, and is without need of a separate composition mechanism.

Each of the four memory sets has its own controller, and their operation is configurable to support different modes of ECR operation. One aspect of this concerns the type of memory related transactions that the memory set controllers support. It is true that on the memory side of a memory set controller individual memory cycles are classifiable as "read" or "write" in nature. But on its system side a memory set controller recognizes several different styles of memory transactions. These include: (A) An overlay write operation implementing "sticky zeros" for data written at different times. If any bit position at an address has a zero written to it at any time during this mode, that bit position at that address will produce a zero when read, even if there were writes of a one to that bit position at that address subsequent to the write of a zero. (B) An overwrite write that is a strict replacement of addressed data by supplied data (i.e., is a regular write). (C) A system write that writes the same data to all Banks if the memory set is external. (D) An analysis read that composes from all Banks if the memory set is external. (E) A buffer memory read that reads data from a selected back if the memory set is external. These styles of memory transaction are each executable with both internal SRAM and external DRAM. The only real difference is how long they take to accomplish, and the recognition that if the above descriptions refer to "all Banks" or "a selected Bank" and the target memory set is internal SRAM, then that target memory set is a memory of one Bank that is at once both "all" Banks and the "selected" Bank. It is clear, then, that while all memory sets can (in principle, anyway) be treated equivalently by the using software, as if they were just SRAM, there are reasons to expect some differences in the internal operation of the various memory set controllers.

There are some additional configuration properties associated with the DRAM memory sets. For the external DRAM memory sets the multiplexing and interleaving mode mentioned above allows full random access at speeds of up to 100 MHz. If it is known that speeds will not exceed 33 MHz, then the internal operation of the ECR's external DRAM memory sets can be configured to provide three times the depth in return for the lower speed. This is accomplished by removing the multiplexing between Groups in favor of just interleaving upon one larger Group; Bank enable bits that were used as part of the multiplexing can now be used as regular address bits to increase the size of the address space of the one Group that remains. Finally, if the testing to the DUT fits the "linear" mode of access (one RAS, many CAS), a twelve-fold increase in memory depth is available, even when the DUT is tested at the highest speed the tester can operate at. This eliminates the interleaving scheme in favor of addressing within a single Bank at a time, and is possible because of the particular nature of DRAM's when used with linear addressing.

Another flexible reconfiguration that is permitted is to combine the external DRAM memory sets into one memory set that has twice the depth of either uncombined set, regardless of other (i.e., the speed related) modes of operation. This may also be done for the internal SRAM memory sets.

DESCRIPTION OF A PREFERRED EMBODIMENT

Figure 1:
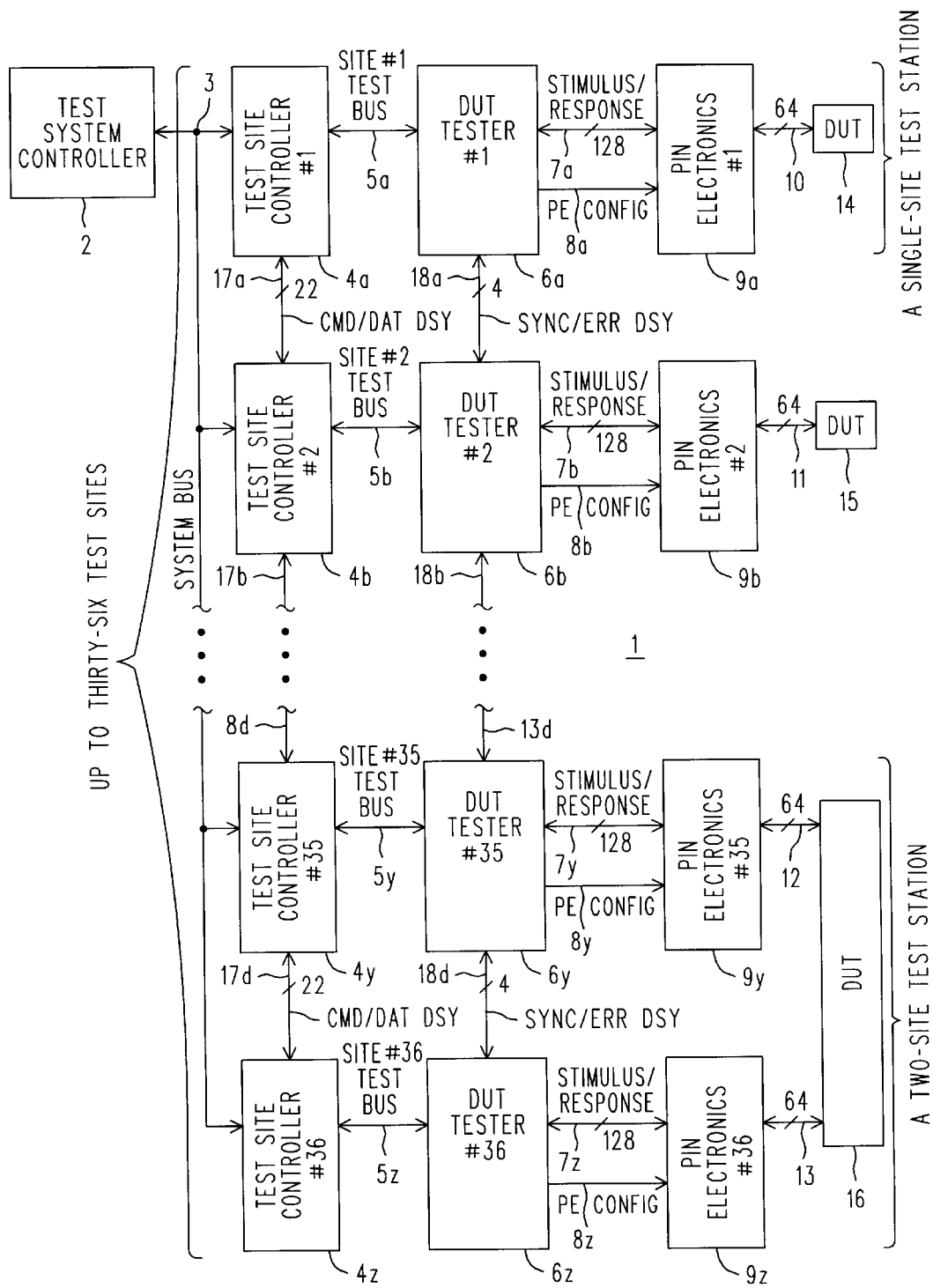
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller#1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named Oust as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix nour "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
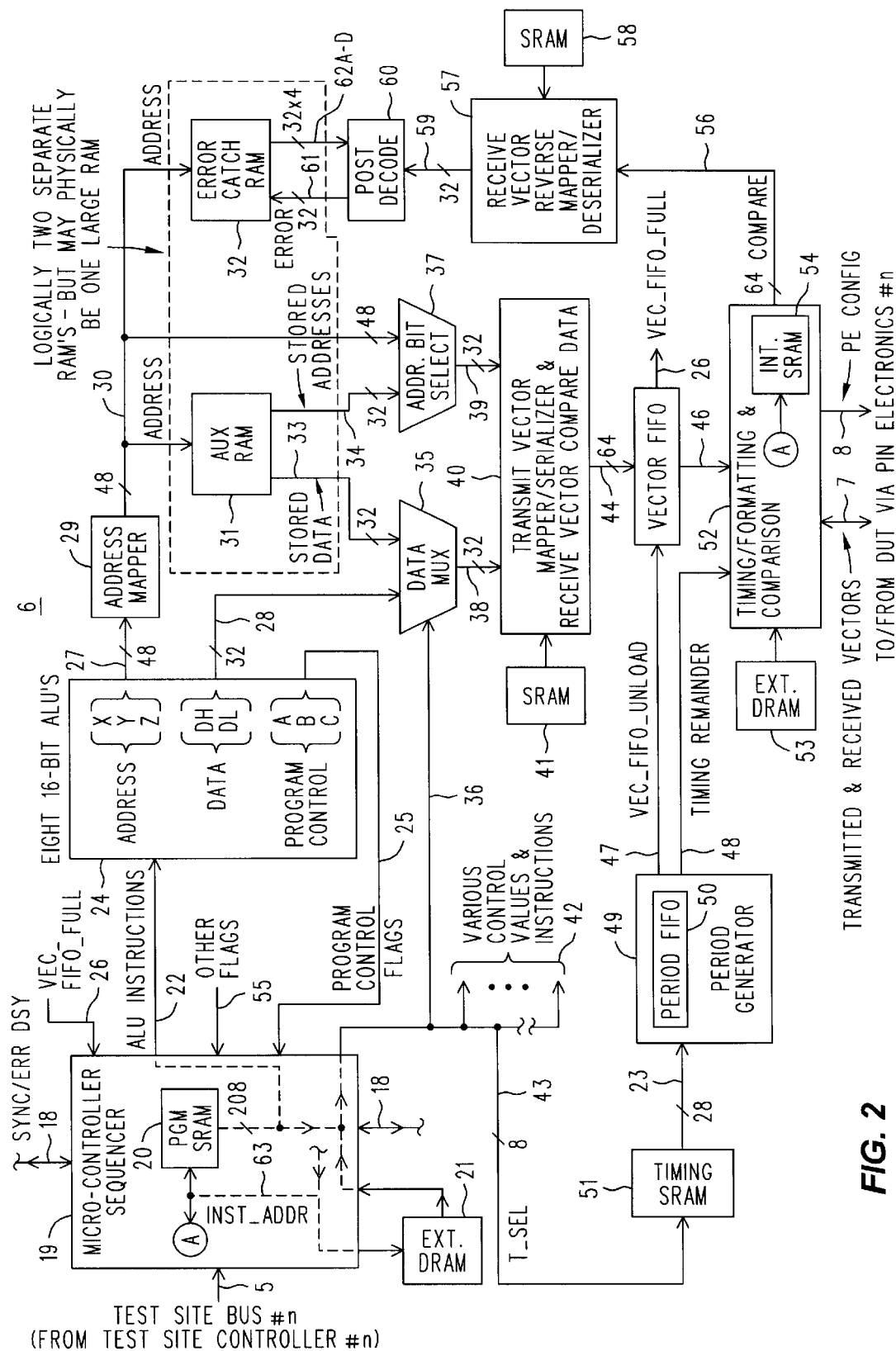
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several Banks whose outputs are applied to MUX's.) In keeping with this, it may be that Stored Data 33 is kept in one Bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.)

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-Bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/ Receive Vector Compare Data Circuit 40 (the other component is the output 39 of the Addr. Bit Select circuit 37). Data MUX 35 performs this selection in accordance with values 36 stored in PGM SRAM 20.

Circuit 40 can perform three functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison. cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A. companion signal TIMING REMAINDER 48 is also applied to circuit 52. It is there that the ultimate resolution to 19.5 picoseconds is accomplished.

Figure 3:
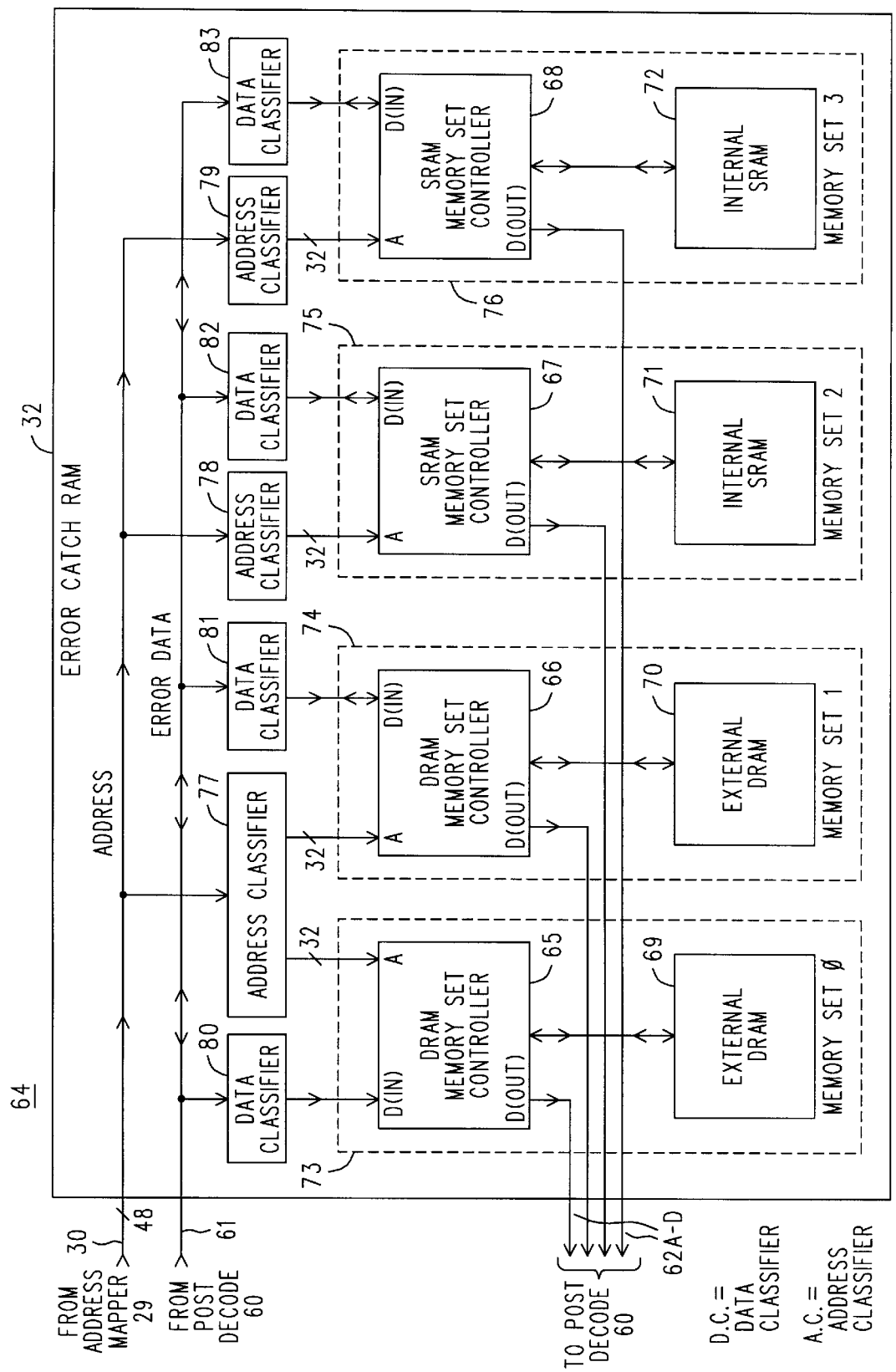
FIG. 3 is a simplified functional block diagram of the ECR (Error Catch RAM) mechanism that appears in the block diagram of FIG. 2.

Refer now to FIG. 3, which is a simplified block diagram 64 of the ECR 32 in the block diagram of FIG. 2. It receives a forty-eight bit mapped address 30 from the Address Mapper 29, which is applied to various Address Classifiers 77, 78 and 79. The Address Classifiers are associated with Memory Sets 73–76, which are each complete memory mechanisms that can individually perform associated ECR functions. Two of these Memory Sets (73, 74) are of external DRAM, while two are of internal SRAM. The two external DRAM Memory Sets will always have the same Address Classifier function in effect, and thus share one common Address Classifier 77. The internal SRAM Memory Sets 75 and 76 each have their own associated Address Classifiers, 78 and 79, respectively. These Address Classifiers may be conventional and can change the address according to principles and for purposes that are well known in the art. They are shown here for the sake of completeness and to promote compatibility between this application and an expected related application. While the Address Classifiers are there to perform a useful function, they may be safely ignored herein by simply assuming that they perform no change to the address.

Each Memory Set includes a Memory Set Controller; the external DRAM Memory Sets 73 and 74 have DRAM Memory Set Controllers 65 and 66, respectively, while the internal SRAM Memory Sets 75 and 76 have respective SRAM Memory Set Controllers 67 and 68. During the testing of a DUT the address for memory transactions directed to any of these Memory Sets arrives at the associated Memory Set Controller from the respectively associated Address Classifier. During the testing of a DUT Error Data 61 arriving from the Post Decode circuit 60 and that is to be written into the ECR is first applied to Data Classifiers 80–83, one of which is associated with each Memory Set. The function of the Data Classifiers is not presently of interest, and we show them here principally for the sake of completeness, and to promote compatibility between this application and an expected related application. As with the Address Classifiers, the Data Classifiers 80–83 may be safely ignored herein by assuming that they simply pass the data through without modification. The Address and Data Classifiers represent high speed paths for addresses and data, respectively, which are intended to operate at the highest speeds necessary. We shall shortly see that the Ring Bus (not yet shown) provides another way to convey addresses and data to the Memory Sets.

At this point we have four Memory Set Controllers (65–68) that each have incoming address and data. Each of these Memory Set Controllers is coupled to an associated memory: DRAM Memory Set Controllers 73 and 74 are respectively coupled to external DRAM's 69 and 70, while SRAM Memory Set Controllers 75 and 76 are respectively coupled to internal SRAM's 71 and 72. These arrangements constitute the four Memory Sets 73–76, two of which (75, 76) have modest amounts of high speed SRAM, and two of which (73, 74) have large amounts of slower DRAM. What is of principal interest to us at present is how the DRAM Memory Sets can be made as fast as the SRAM Memory Sets, as well as how to incorporate certain alternatives concerning configuration of the DRAM, depending upon user preference and test program strategy. Thus, it is going to turn out that the DRAM Memory Set Controllers 65 and 66 are configurable, perform different types of memory transactions, and are not altogether the same as the simpler SRAM Memory Set Controllers 67 and 68. For the sake of brevity, FIG. 3 does not show the structure that provides this flexibility; for now let's just say that each Memory Set Controller is connected to the Ring Bus (not yet shown), from which it is instructed in the particular mode of operation and configuration that are desired. Some of these modes involve how data is stored, and some have to do with getting it back out again. We shall be principally interested in the modes and configurations of the DRAM Memory Sets. To conclude, then, note that each Memory Set does have an associated Data Out (62A–D) which is sent to the Post Decode Mechanism 60 for further processing.

Figure 4:
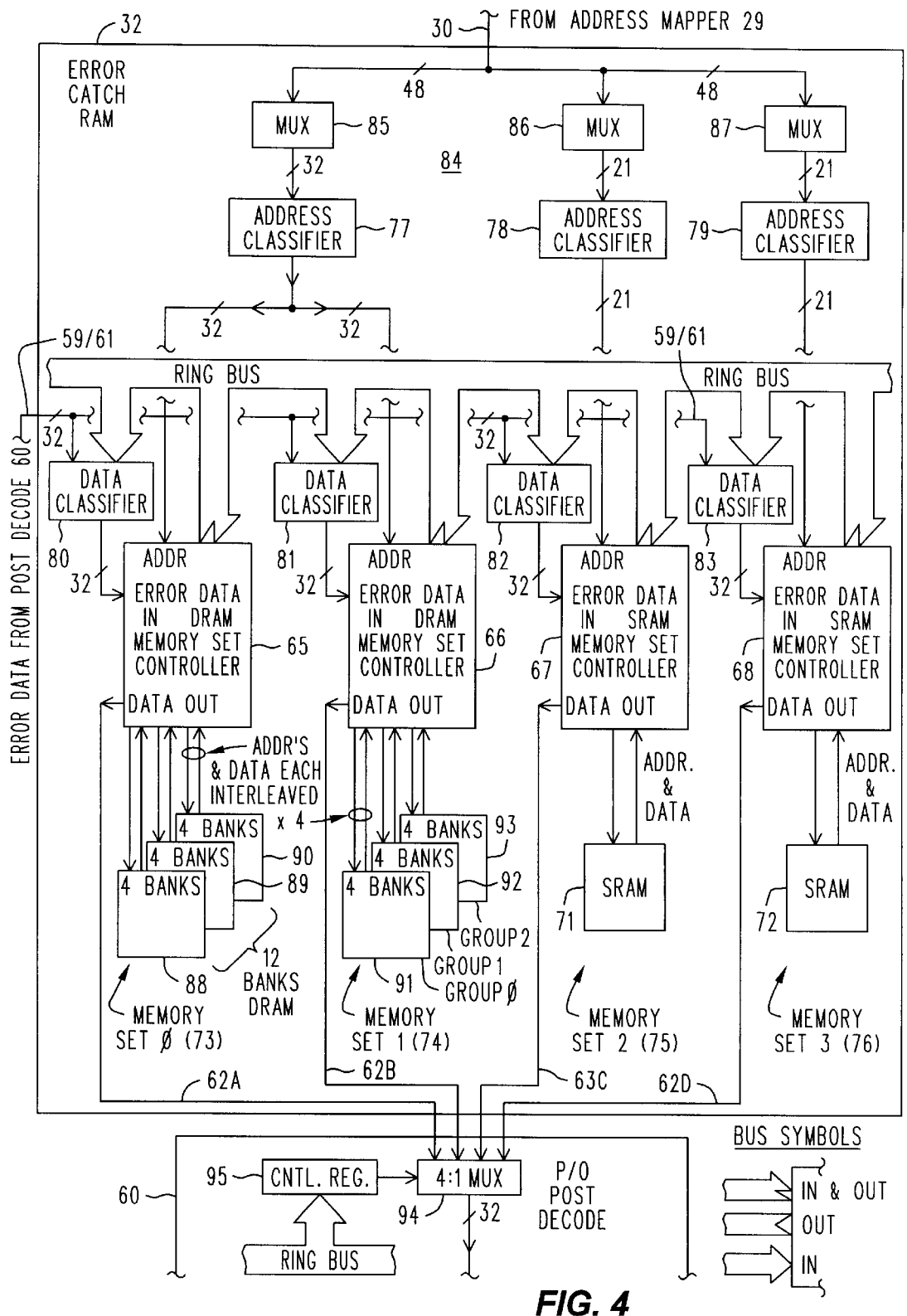
FIG. 4 is a more detailed block diagram of the ECR mechanism of FIG. 3.

Now consider FIG. 4, which is a more detailed block diagram 84 of the ECR 32 that was described in conjunction with FIG. 3. It is much the same, and similar elements have been designated with common reference numerals. For our present purposes it is sufficient to point out the incremental differences present in FIG. 4. Specifically, note that each of the Address Classifiers (78–79) is preceded by an associated MUX (85–87). These MUX'es assist in the process of address refinement, and especially in getting the size of the address down from forty-eight bits to thirty-two. That said, it will be appreciated that the situation with regard to these MUX'es is similar to that for the Address Classifiers and the Data Classifiers: while they are there for useful reasons we are not presently concerned about those, we show these MUX'es mainly for the sake of completeness (and to get the address down to thirty-two bits!). Furthermore, it will be noted that the Ring Bus 85 is coupled to each of the Memory Set Controllers (65–68). Note that the Data Out's (62A–D) from Memory Set Controllers are, once they get to the Post Decode circuit 60, applied to a 4:1 MUX 94 that, according to a Control Register 95 set by the Ring Bus, determines which output is selected for further processing.

Our main interest in FIG. 4 has to do with the overall organization of the memory controlled by the various Memory Set Controllers 65–68. In the case of Memory Set 2 (75) and Memory Set 3 (76) that memory is simply SRAM disposed as a single (within its Memory Set) address space, and that operates in a conventional manner. However, in the case of Memory Set 0 (73) and Memory Set 1 (74) the memory for each is three Groups of four Banks each, and the format for an address depends upon the mode and configuration information currently applicable to those Memory Sets.

So, for example, Memory Set 0 (73) has three Groups 88, 89 and 90, while Memory Set 1 (74) has Groups 91, 92 and 93. In one high speed mode for random addressing consecutive memory transactions are automatically sent to different Groups (multiplexing), each of which has its own hardware path for address and data. Each of these Groups is made up of four Banks (four instances of an address s space), for which the memory operations can be interleaved in accordance with principles and practices understood in the art. Specifically, the type of DRAM preferred for use at present is SDRAM, which implies a particular strategy for interleaving. It will be appreciated that there are other types of DRAM and that other mechanisms for interleaving are possible, besides the one to be described below. In another mode for slower random addressing the Groups are addressable instead of being selected automatically. In this slower mode extra address bits for the Group are used to select the hardware path. In this mode an address specifies a Group and a Bank address within that Group of interleaved Banks. In yet another high speed mode with well behaved addressing, both multiplexing and interleaving are turned off, and address has Group selection bits, Bank selection bits and within-Bank address bits. In a narrow word mode of operation still additional addressing bits are used to specify a field within the entire word that is the target of the memory transaction.

Figure 5:
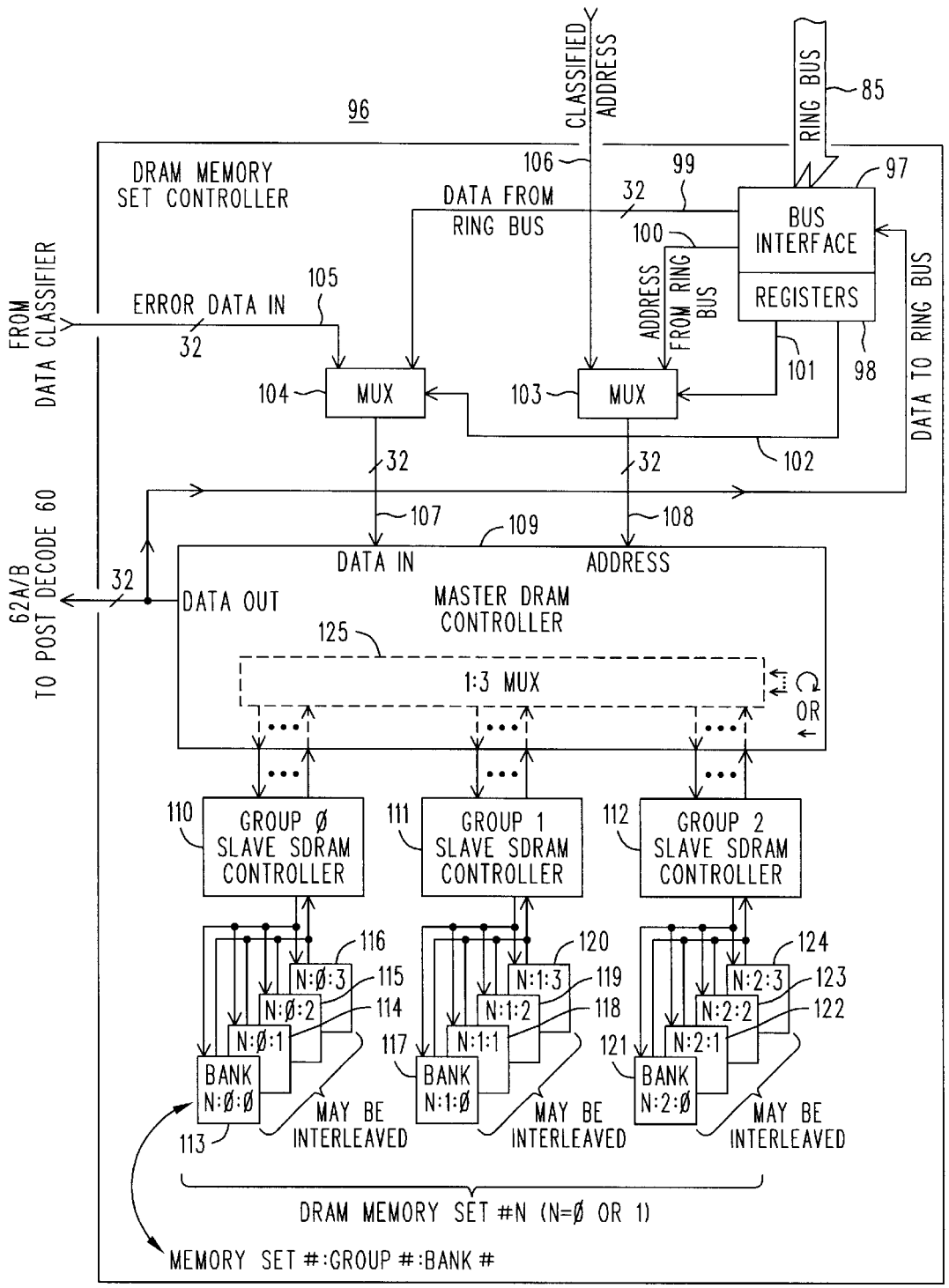
FIG. 5 is a simplified block diagram of a DRAM Memory Set Controller mechanism that appears in the block diagrams of FIGS. 3 and 4.

Turn now to FIG. 5, which is a simplified block diagram 96 of a DRAM Memory Set Controller (65, 66) appearing in FIGS. 3 and 4. It receives as input a CLASSIFIED ADDRESS 106, mode and configuration information from the Ring Bus 85, and ERROR DATA IN 105 from the associated Data Classifier. As before, it produces DATA OUT (62A/B).

However, it can now been seen that other sources of address and data may provide those quantities via the Ring Bus 85. That is, there is a Bus Interface 97 that couples the Ring Bus to the DRAM Memory Set Controller, and via that interface DATA FROM RING BUS 99 and ADDRESS FROM RING BUS 100 are available. A MUX 104 selects whether ERROR DATA IN 105 or DATA. FROM RING BUS 99 is sent forward as data 107, thence to be applied to the DATA IN terminal of a Master DRAM Controller 109. Likewise, a MUX 103 selects between CLASSIFIED ADDRESS 106 and ADDRESS FROM RING BUS 100 to produce the address 108 that is applied to the ADDRESS terminal of the Master DRAM Controller. A collection of one or more registers 98 whose content is set by traffic on the Ring Bus produces control signals 101 and 102 that indicate the selections to be made by MUX'es 103 and 104, respectively.

It will further be appreciated that DATA OUT (62A/B) is additionally applied to the Bus Interface 97, thus allowing that DATA OUT to be sent over the Ring Bus.

A principal function of the DRAM Memory Set Controller is the allocation or distribution of the various memory transactions among the three Groups. In a high speed mode of operation it performs this s allocation in a round robin fashion using (the equivalent of) a 1:3 MUX 125. The MUX 125 is shown as a dotted line, since it will become clear that, while there could indeed be a MUX, in the present preferred embodiment, there is not an actual MUX at that location. Instead, and as will become clear in conjunction with FIG. 6, there are multiple instances of addressable data sources under the control of a sophisticated rule following mechanism (a state machine).

To complete our discussion of FIG. 5, note that the 1:3 MUX 125 drives three Slave SDRAM. Controllers (110–112), there being one such Slave SDRAM Controller for each of Group 0, Group 1 and Group 2. Each SDRAM Slave Controller has as its Group a collection of four Banks of SDRAM. For example, the SDRAM Controller 110 for Group 0 is coupled to Banks 113, 114, 115 and 116. In similar fashion Group 1 has Banks 117–120, while Group 2 has Banks 121–124. The result is a total of twelve Banks for each DRAM Memory Set, of which there are two.

The SDRAM of each Group can be arranged to operate in several modes or configurations. When configured for random addressing operation at the highest speed, multiplexing between Groups happens at the highest rate, and consecutive memory operations are always and automatically sent to the next Group in a cyclic sequence thereof. Within a Group, memory operations are interleaved to evenly distribute them among the four Banks. A regular cyclic sequence is preferred here, too. The interleaving produces a four-fold increase in speed, which, when combined with a three fold increase provided by the multiplexing, is an increase in speed by a factor of twelve. This manner of operation treats each Bank as a full address space, with no attempt to control ahead of time which of the twelve Banks is the target for a particular memory transaction. That is, data to be stored might end up in any one of the twelve Banks, and a simple read from the memory might retrieve contents from any one of the twelve Banks. There is no reason to expect that the content of an address at one Bank is the same as the content of that same address in another Bank. At this point is clear, however, that data can be stored at a rate at least ten times that of the rate for a single Bank of DRAM. The price we pay is, of course, that in order to read data out at an address we need to investigate the content of that address at all twelve Banks. (Strictly speaking, this is not always true. There is a mode of operation where the content of only four Banks need be investigated. More will be said about this shortly below.)

At this point we can set out some of the terminology and brief descriptions for some of the various modes and configurations that the DRAM Memory Sets can support. Here they are:

Random 100 MHz (R100)

Full speed write operation using three multiplexed Groups of four interleaved Banks each to permit randomly addressed writes to an address space equal in depth to one Bank Both multiplexing and interleaving are in use. Data will be written to the 'next' Bank in the 'next' Group, and an incoming address has no bits to identify a particular Group or particular Bank.

Random 33 MHz (R33)

Reduced speed write operation using an addressed Group of four interleaved Banks to permit randomly addressed writes to an address space equal in depth to three Groups, which is equivalent to an address space three Banks deep. Interleaving is in use but not multiplexing. Data will be written to the 'next' Bank in the addressed Group, and an address has Group selection bits but no Bank selection bits. Group selection bits are most significant address bits, so except at Group boundaries, consecutive addresses are to consecutive within-Bank locations, but at a Bank determined by the automatic interleaving.

Localized 100 MHz (L100)

Full speed operation using an addressed Bank within an addressed Group to permit both reads and writes having minimal ROW address changes to an address space equal in depth to twelve Banks. An incoming address has Group selection bits, Bank selection bits and address bits specifying a within-Bank location. No multiplexing, no interleaving, and within-Bank addressing is to meet locality requirements. Lack of locality is automatically detected and needed readdressing is performed. Lack of locality is not fatal, but if consistently violated the result is doggy slow performance.

Stacked Memory Sets

In any of the above, Memory Sets 0 and 1 can be combined to present twice the depth of address space, as can Memory Sets 2 and 3, also. The incoming address has Memory Set selection bits.

Narrow Words

In any of the above modes a Memory Set can be configured to have a word width that is a power of two and less than or equal to thirty-two. Such a narrow word is a field within the full word width of an addressed word, is located on power-of-two boundaries, and uses extra address bits to locate the field within the addressed word. Works with R100 and R33, but not with L100.

Composition

In the above "Random" access modes the need to read multiple Banks when preparing output data for a read is supported by a hardware assist that merges the results at an address from the four Banks of the appropriate Group for R33 and from all twelve Banks for R100. By enclosing a compose operation in a loop that walks the within-Bank address while storing the results in all Banks or in a known Bank, an entire region of memory can be composed ahead of time to permit faster access during analysis of test results.

Composition Integrity

Detection of loss of composition to a composed region of memory has a hardware assist.

Hidden Refresh

The refresh operation of the DRAM's in the various Banks is automatically performed without interference with any of the above modes or configurations.

In concert with the above collection of capabilities, individual memory transactions can be described as belonging to one of the following categories:

Overwrite Write (OWW)

A strict replacement write to all (each of the) one, four or twelve Banks at one address; previous contents are lost. Works with R100 (12 Banks), R33 (4 Banks) and L100 (1 Bank), but does not preserve rated speed operation for Random addressing. Maintained for compatibility with test programs for older memory testers. Uses classified address and classified data.

Overlay Write (OLW)

A read-modify-write operation supporting "sticky zeros" to the 'next' of one, four or twelve Banks. A zero in a bit position will not be overwritten with a one, but a one can be overwritten with a zero. Works at rated speed with R100 (12 Bank), R33 (4 Banks) and L100 (1 Bank). This is the principal way to write data during testing, and allows the trapping of a failure in a bit position over repeated testing at a DUT address. Not to be confused with composition, since unless the data is written in L100 (an onerous requirement) it will still need to be composed. Uses classified address and classified data.

System Write (SYW)

Writes to a single Bank in L100. Writes the same thing to all four Banks of an addressed Group in R33 and to all twelve Banks in R100, but does not preserve rated speed. Source for the address and data is the Ring Bus.

System Read (SYR)
  Reads from a single Bank in L100. Performs at the address a composed read from all four Banks of an addressed Group in R33 and from all twelve Banks in R100, but does not preserve rated speed. Address source and data destination is the Ring Bus.

Analysis Read (ANR)
  Performs at the address a composed read from all four Banks in of an addressed Group R33 and from all twelve Banks in R100, but does not preserve rated speed. Uses the classified address and sends the data to Post Decode via paths 62 A–D.

Buffer Memory Read (BMR)
  Full speed (100 MHz) read at a random address for whichever Bank is 'next.' Works with L100 (same Bank is always 'next'), R33 ('next' of four Banks in the addressed Group), and R100 ('next' of four Banks in the 'next' of three Groups). Uses the classified address and sends the data to Post Decode via paths 62 A–D.

Clearly, some of the above arise from the multiplexing and interleaving scheme to be described in more detail below. The multiplexing and interleaving schemes are, of course, limited to the DRAM Memory Sets (the SRAM Memory Sets go fast to begin with). This does not mean, however, that these same abilities or modes of operation cannot be supported by the SRAM Memory Sets. In general, memory transactions that can be directed to one Memory Set can be directed to any other, subject only to size constraints. An SRAM Memory Set will honor any style of operation that a DRAM Memory Set would. The difference is how the Memory Set controller internally implements the desired transaction. for example, in the case of an Analysis Read (compose) an SRAM Memory Set need not bother beyond doing the simple read, since its data is already composed in the first place.

These various styles of memory transaction may be combined as needed within a test program. For example, after testing a loop can compose all data within a range of addresses for a particular Memory Set. Then BMR's can be used (at high speed) to get at the data in any random order. This works because at every address (in the composed range) each Bank has the same data.

Experience suggests that the above memory mode/configuration and transaction information can require a significant amount of time to digest. The following Table I is offered as a condensed summary to aid in the digestion process. The notation W 1/4 denotes writing to one out of four Banks; R denotes a read.

ADDRESS 108 from the associated Memory Set Controller are coupled to respective FIFO's 127 and 128. On the output side of FIFO 127 the WRITE DATA 131 is applied to further FIFO's that are associated with the different Groups. These are FIFO's 137, 139 and 141. Their outputs (166, 168 and 170) are the actual write data busses for Group 0 through Group 2, respectively. In a similar fashion, the output of FIFO 128 is applied to FIFO's 138, 140 and 142, whose outputs in turn become the address busses (167, 169 and 171) for those Groups.

The Master DRAM Controller 109 includes a State Machine 193 that is coupled to ADDRESS 132 as well as to the Ring Bus 85. Among other things, various Mode Control Registers 130 can be set up to indicate the desired mode and configuration. The State Machine 193 is also responsible for selecting what Group is to receive the next memory transaction, in accordance with the mode and configuration in effect. That is, it will either honor a field of Group selection bits in an incoming address or it will automatically select the next Group. To produce a memory operation for a Group it issues the appropriate GROUP CYCLE CONTROL signals 133. These are latched into the FIFO for that Group (143 for Group 0, 144 for Group 1 and 145 for Group 2), from whence they emerge in due course on the memory CYCLE CONTROL busses (172, 173 and 174) for those Groups. Other reasons for the State Machine 193 being connected to the ADDRESS 132 will become clear during the discussion below of the addressing scheme for the ECR's DRAM Memory Sets.

Read operations produce GROUP READ DATA 134, 135 and 136 for Group 0, Group 1 and Group 2, respectively. These results are applied to a Composer Circuit 146, as well as to a MUX 148. The MUX 148 selects between one of the individual GROUP READ DATA and the composed version of data for that address (COMPOSED GROUP READ DATA 147). The astute reader will note that if a compose operation is underway, then each of the GROUP READ DATA busses will need to provide four words of data, which implies the need for four consecutive READ's (involving the ADDRESS FIFO's 138, 140 and 142 and the CYCLE CONTROL FIFO's 143, 144 and 145). Management of such housekeeping is under the control of the State Machine 193, and occurs in response to the nature of the various memory transaction that can be specified. In any event, the selected (by MUX 148, under the control of the Mode Control Registers 130) data appears as GROUP READ DATA 149, which is then either latched into FIFO 150 to become READ DATA 62 A/B, or, is applied as if it were WRITE DATA 107 and written back into (all Banks of) the memory. Again, it is the State Machine 193 that oversees these various memory transactions.

TABLE I

MEMORY TRANSACTIONS

| SOURCE/ DEST. | OPERATION | NAME | DESCRIPTION | MODE: L100 | R33 | R100 |
|---|---|---|---|---|---|---|
| RING BUS | SYSTEM WRITE | SYW | ALL (1, 4, 12) BANKS | W 1/1 | W 4/4 | W 12/12 |
|  | SYSTEM READ | SYR | ALL (1, 4, 12) BANKS | R 1/1 | R 4/4 | R 12/12 |
| H/S ADDR. AND DATA | PATTERN WRITE | OWW | ALL (1, 4, 12) BANKS | W 1/1 | W 4/4 | W 12/12 |
|  | PATTERN READ | ANR | ALL (1, 4, 12) BANKS | R 1/1 | R 4/4 | R 12/12 |
| H/S ADDR. AND DATA | PATTERN WRITE | OLW | NEXT (1, 4, 12) BANKS | W 1/1 | W 1/4 | W 1/12 |
|  | PATTERN READ | BMR | NEXT (1, 4, 12) BANKS | R 1/1 | R 1/4 | R 1/12 |

Figure 6:
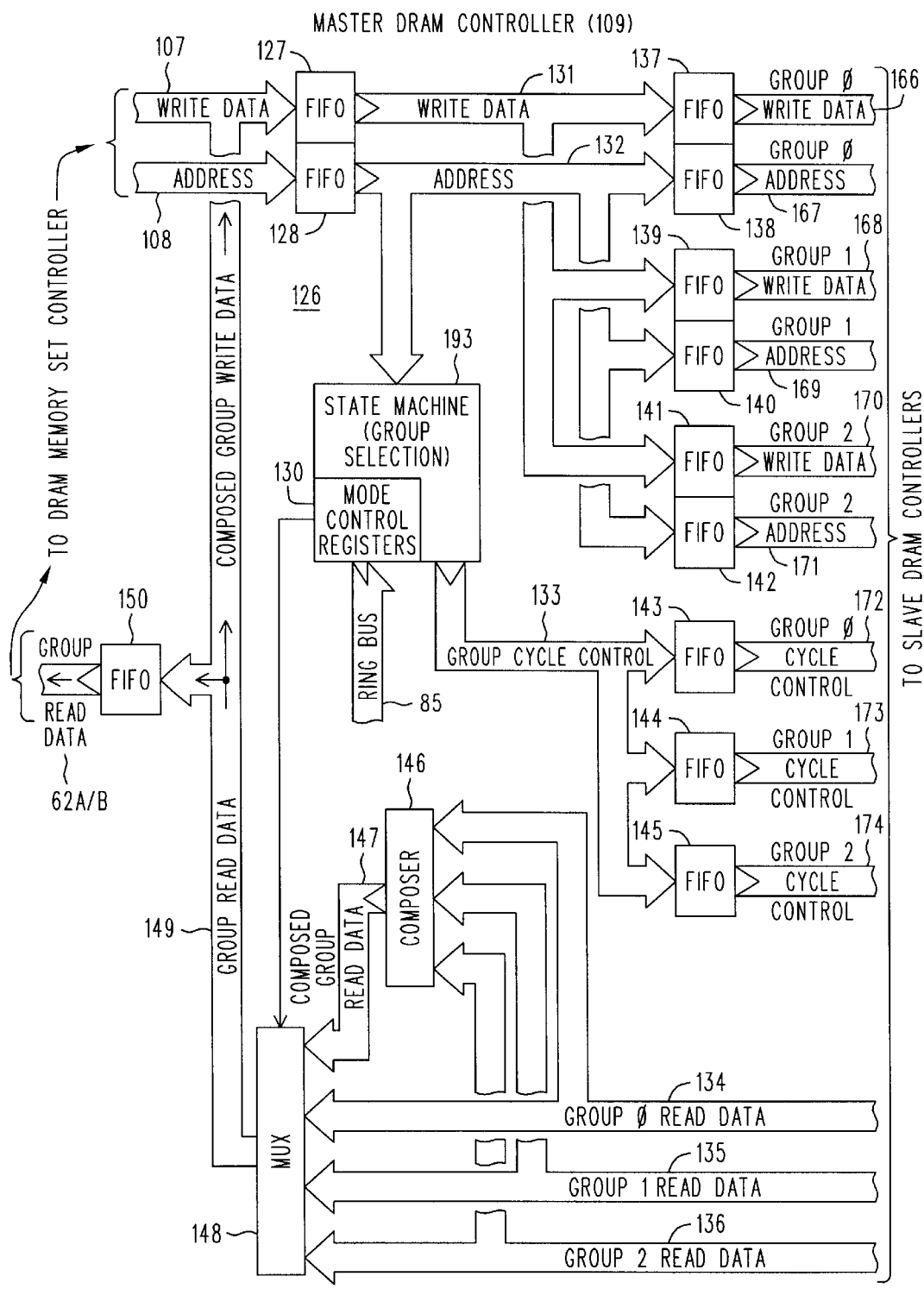
FIG. 6 is a block diagram of a Master DRAM Controller mechanism that appears in the block diagram of FIG. 5.
Figure 7:
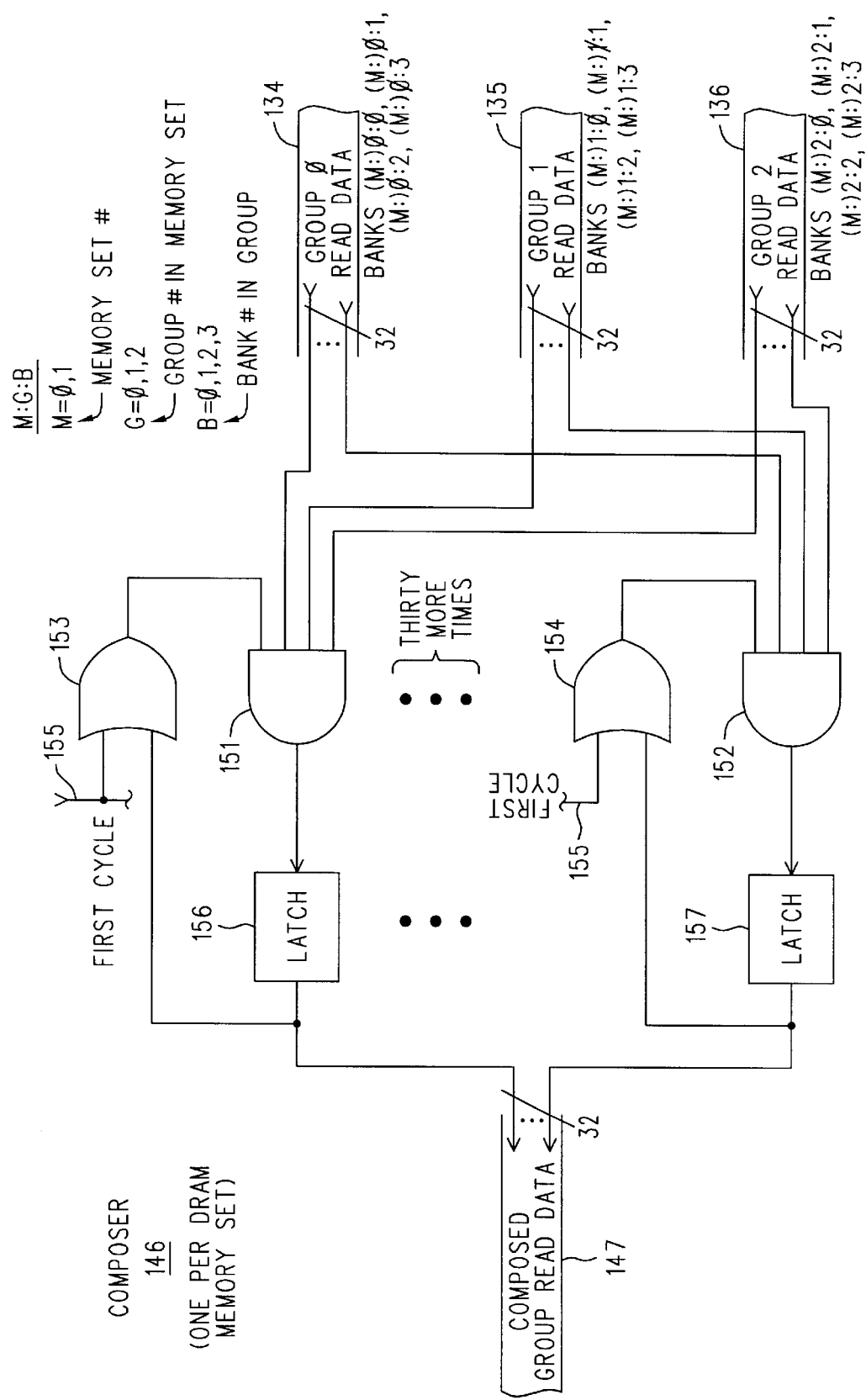
FIG. 7 is a block diagram of a Composer circuit that appears in the block diagram of FIG. 6.

To resume our discussion, refer now to FIG. 6, which is a block diagram 126 of the Master DRAM Controller 109 that appears in FIG. 5. An applied WRITE DATA 107 and Before taking up the Slave SDRAM Controllers, turn now to FIG. 7, which is a block diagram of the COMPOSER circuit 146. Recall that its function is to read from the same address for all twelve Banks across three Groups (data stored as R100), or for all four Banks of one Group (data stored as R33), and merge the contents into one word, preserving zeros in a bit position, even though other words in the twelve (four) might have a one in that bit position To this end, the Master DRAM Controller of FIG. 6 will arrange that all four Banks at each appropriate Group will be read, using the same address. Thus it is for an R100 case that Banks 0, 3, 6 and 9 (in a sequence of zero to eleven Banks so named for R100 operation in this example—within any Group the Banks therein are simply named zero through three) will appear in sequence on GROUP 0 READ DATA 134; Banks 1, 4, 7 and 10 will appear in sequence on GROUP 1 READ DATA 135; and, Banks 2,5,8 and 11 will appear in sequence on GROUP READ DATA 136. The data for Banks 0, 1 and 2 will appear simultaneously during one cycle, while that for Banks 3, 4, an 5 will appear simultaneously during the next cycle, and so forth. For each bit in those DATA 134–136, there is a corresponding AND gate (e.g., 151 & 152) whose output is true only when that bit in all three Groups is set, which is to say, if there were any recorded failures (0's) at that address, the output of the AND gate would also be a zero. We have to do this four times (once for each stage of interleaving, Bank to Bank), and capture the output of the AND gate in an associated latch (e.g., latch 156 for AND gate 151, latch 157 for AND gate 152). The state of the latch is fed back to the AND gate, so that if the latch ever captures a zero the output of the AND gate remains zero, despite there being Banks that might still need to be checked. (We shall henceforth dispense with naming Banks as zero through eleven, in favor of a more useful format set out below and matching the one set out in FIG. 5. Despite its useful suggestiveness, the names zero through eleven make sense only for R100 operation, and to extend that style to R33 operation would be confusing.)

The scheme as described to this point works provided the latches are set before composition begins. That, however, takes time, and it is desirable to have the scheme work regardless of the initial state of the latches 156 through 157. This is arranged by having a FIRST CYCLE signal 155 applied as an input to two-input OR gates (153, 154) that also receive the latch output as the other input. The outputs of the OR gates 153 through 154 are applied as the "recirculating" inputs to the AND gates 151 through 152. The FIRST CYCLE signal 155 is generated by the State Machine 193 in Master DRAM Controller 109 and is TRUE only during the read of the first Banks of each Group. For the two DRAM Memory Sets (zero and one) these are banks 0:0:0, 0:1:0, 0:2:0, 0:3:0 and 1:0:0, 1:1:0, 1:2:0, 1:3:0 (the format here is Memory Set #: Group #: Bank #). The effect of the signal FIRST CYCLE 155 is to make the state of the latches 156 through 157 be don't cares during that first cycle, and allow the AND gates 151 through 152 to produce the correct results. Those results do then correctly set the latches 156 through 157, after which FIRST CYCLE 155 goes FALSE for the duration of the composition operation.

After all four sets of Banks have been read the thirty-two latches 156 through 157 contain the COMPOSED GROUP READ DATA 147, which is then used by the Master DRAM Controller 109 of FIG. 6 in the manner previously indicated. An additional piece of information is needed to appreciate how this same mechanism works for R33 operation. An unused or inactive GROUP N READ DATA. BUS (would be two of 134, 135 and 136 during R33) appears as all one's. This allows the same mechanism that works for R100 to also function correctly for R33.

Figure 8:
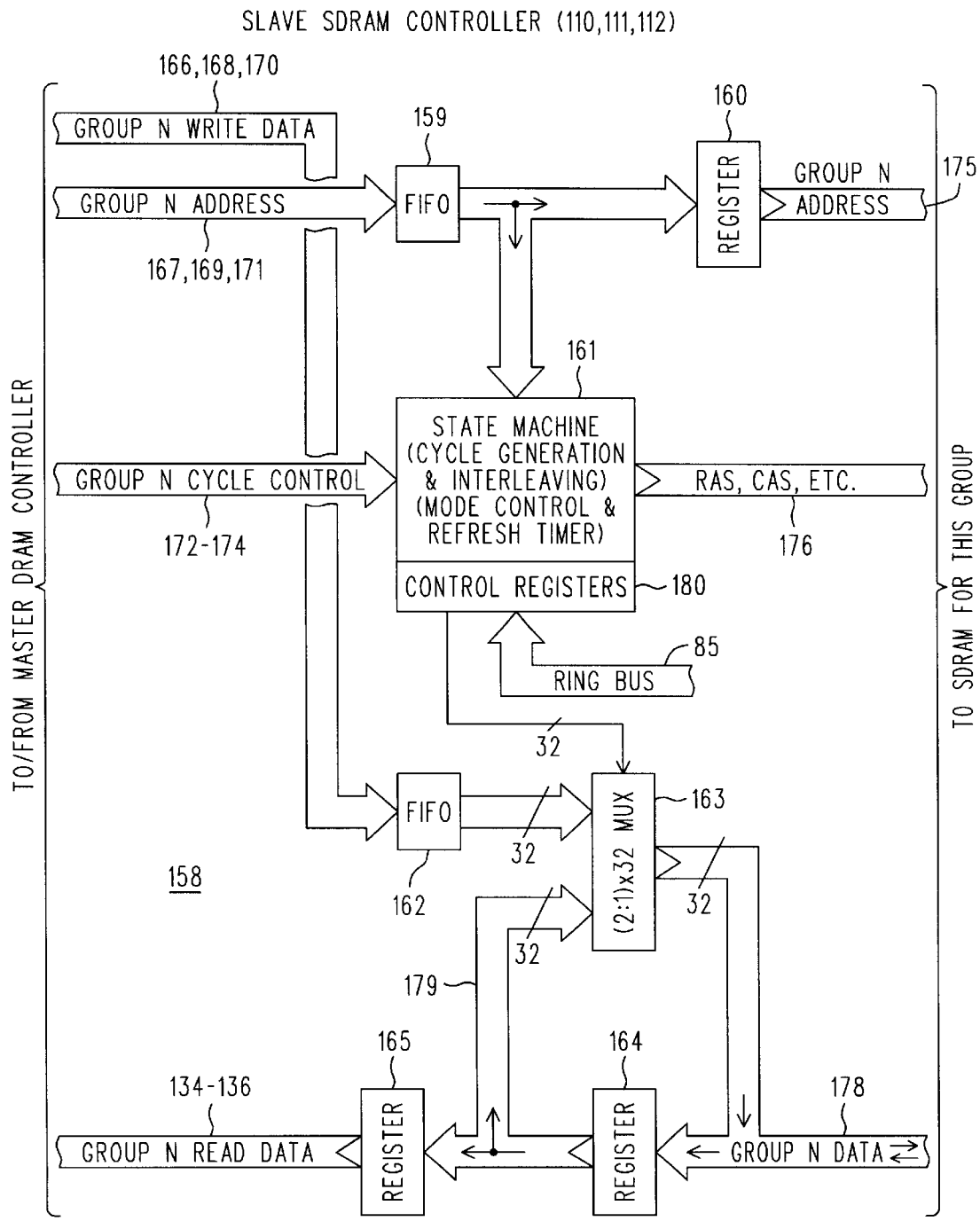
FIG. 8 is a block diagram of a Slave SDRAM Controller mechanism that appears in the block diagram of FIG. 5.

Refer now to FIG. 8, which is a block diagram 158 of a Slave SDRAM Controller (110, 111 and 112 of FIG. 5). A central element of the Slave SDRAM Controller is a State Machine 161, which includes some control registers 180 that are set by coupling to the Ring Bus 85. A GROUP N ADDRESS (will be one of 167, 169 or 171) is applied to a FIFO 159, from whence it is captured by a register 160 and is also coupled to the State Machine 161. (The value for N will be understood to be zero, one or two.) From the register 160 the GROUP N ADDRESS 170 is applied to the SDRAM chips that make up the Group of interest. The State Machine 161 also receives GROUP CYCLE CONTROL information (will be one of 172, 173 or 174) from the Master SDRAM Controller 109. From this, in addition to knowing what mode of operation and configuration is in effect, the State Machine 161 can create the appropriate sequence of SDRAM control signals 176 (includes RAS, CAS, Chip Enable, etc.) for the Group of interest. It is the State Machine 161 that actually accomplishes the interleaving by the way it generates those control signals 176.

The State Machine 161 also contains a refresh timer (not explicitly shown) that, when it times out (typically after about forty microseconds), stalls further operations from the outside while some installment of refresh is performed. Refresh is performed a row at a time, for all columns in the row. Each, next installment of refresh does the next row. To facilitate this manner of operation, the Slave DRAM Controller and its outer environment are pipelined (all those FIFO's) and the native rate of Slave SDRAM Controller operation is 143 MHz, so that the approximately 7% of its time devoted to refresh still leaves it time to respond at an aggregate 100 MHz rate.

Meanwhile, the GROUP N WRITE DATA (will be one of 166, 168 or 170) is applied to a FIFO 162, whose output is thence applied as an input to a (2:1) X 32 MUX 163. The output of the MUX 163 is coupled to the signals that are the GROUP N DATA 178 for the Group of interest. On these lines 178 will appear both data to be written and data that has been read. Data that is to be written comes from MUX 163, and originates either with the GROUP N WRITE DATA via FIFO 162 or from data that has just been read and stored in a register 164. Path 179 represents this latter case, which occurs when read-modify-write style operation is to be performed. (The "modify" part can be complex, is done with the MUX 163, and is not of interest here.) Data that has been read for use outside the Slave SDRAM Controller is further latched into a register 165, from whence it becomes GROUP N READ DATA (will be one of 134, 135 or 136).

The various operational modes and configurations of the Memory Sets are facilitated by an addressing scheme illustrated by the following TABLE II through TABLE X. What is shown is for SDRAM Memory Sets. The addressing scheme for the SRAM Memory Sets is similar, but also somewhat simpler (since they do not have Groups and Banks).

TABLE II

SYMBOL DEFINITION

| Symbol | Meaning |
|---|---|
| M | Memory Set Select bit for stacking Memory Sets |
| G | Group Select bits for stacking Groups within a Memory Set |
| B | Bank Select bits for stacking Banks within a Group |
| R | Row Address bits |
| C | Column Address bits |
| F | Field Select bits for narrow word operation |
| E | Chip Enable |

TABLE III

SUPPORTED PARTS

| Data Bits | Row Bits | Col Bits | Bank Bits | Organization |
|---|---|---|---|---|
| 512M | 13 | 10 | 2 | (8M addresses × 16 data bits) × 4 Banks |
| 256M | 13 | 9 | 2 | (4M addresses × 16 data bits) × 4 Banks |
| 128M | 12 | 9 | 2 | (2M addresses × 16 data bits) × 4 Banks |
| 64M | 12 | 8 | 2 | (1M addresses × 16 data bits) × 4 Banks |

TABLE IV

SAMPLE TEST PROGRAM MAPPINGS

| | |
|---|---|
| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
| Default Address from Mapper | <----------------X----------------> <----------------Y----------------> |
| Typical Address from Mapper | <-------Z------> <-----------X-----------> <-----------Y-----------> |

TABLE V

512M SDRAM SINGLE MEMORY SET (R100‡ OR R33)

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Mode | |
| 1 bit | G G E R R R R R R R R R R R R C C C C C C C C C C F F F F |
| 2 bit | G G E R R R R R R R R R R R R C C C C C C C C C C F F F F |
| 4 bit | G G E R R R R R R R R R R R R C C C C C C C C C C F F F |
| 8 bit | G G E R R R R R R R R R R R R C C C C C C C C C C F F |
| 16 bit | G G E R R R R R R R R R R R R C C C C C C C C C C F |
| 32 bit | G G E R R R R R R R R R R R R C C C C C C C C C C |

‡G IS ABSENT OR IGNORED DURING R100 OPERATION

TABLE VI

512M SDRAM STACKED MEMORY SET (R100‡ OR R33)

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Mode | |
| 1 bit | G G E M R R R R R R R R R R R R C C C C C C C C C C F F F F |
| 2 bit | G G E M R R R R R R R R R R R R C C C C C C C C C C F F F F |
| 4 bit | G G E M R R R R R R R R R R R R C C C C C C C C C C F F F |
| 8 bit | G G E M R R R R R R R R R R R R C C C C C C C C C C F F |
| 16 bit | G G E M R R R R R R R R R R R R C C C C C C C C C C F |
| 32 bit | G G E M R R R R R R R R R R R R C C C C C C C C C C |

‡G IS ABSENT OR IGNORED DURING R100 OPERATION

TABLE VII

1-BIT MODE SINGLE MEMORY SET‡

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Type | |
| 512M | G G E R R R R R R R R R R R R C C C C C C C C C C F F F F |
| 256M | G G E R R R R R R R R R R R R C C C C C C C C C F F F F |
| 128M | G G E R R R R R R R R R R R R C C C C C C C C C F F F F |
| 64M | G G E R R R R R R R R R R R R C C C C C C C C F F F F |

‡G IS ABSENT OR IGNORED DURING R100 OPERATION

TABLE VIII

32-BIT MODE SINGLEMEMORY SET‡

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Type | |
| 512M | G G E R R R R R R R R R R R R R R C C C C C C C C C C |
| 256M |    G G E R R R R R R R R R R R R R R C C C C C C C C C C |
| 128M |       G G E R R R R R R R R R R R R R R C C C C C C C C C C |
| 64M |          G G E R R R R R R R R R R R R R R C C C C C C C C C C |

‡G IS ABSENT OR IGNORED DURING R100 OPERATION

TABLE IX

SINGLEMEMORY SET L100 (ALWAYS 32-BIT)

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Type | |
| 512M | G G B B E R R R R R R R R R R R R R R C C C C C C C C C C |
| 256M |    G G B B E R R R R R R R R R R R R R R C C C C C C C C C C |
| 128M |       G G B B E R R R R R R R R R R R R R R C C C C C C C C C C |
| 64M |          G G B B E R R R R R R R R R R R R R R C C C C C C C C C C |

TABLE X

STACKED MEMORY SETS L100 (ALWAYS 32-BIT)

| Bit Pos | 3 3 2 2 2 2 2 2 2 2 2 2 1 1 1 1 1 1 1 1 1 1 0 0 0 0 0 0 0 0 0 0<br>1 0 9 8 7 6 5 4 3 2 1 0 9 8 7 6 5 4 3 2 1 0 9 8 7 6 5 4 3 2 1 0 |
|---|---|
| Type | |
| 512M | G G B B EM R R R R R R R R R R R R R R C C C C C C C C C C |
| 256M |    G G B B EM R R R R R R R R R R R R R R C C C C C C C C C C |
| 128M |       G G B B EM R R R R R R R R R R R R R R C C C C C C C C C C |
| 64M |          G G B B EM R R R R R R R R R R R R R R C C C C C C C C C C |

Table II identifies the meanings of various symbols used Tables V–X. That is, it tells what interpretation is to be given to the various bit positions in an address under different ECR modes of operation and configuration. The addressing schemes set out in Tables V–X should be thought of as being what is applied to the State Machines in the Master and Slave Memory Controllers, rather than directly to the memory parts themselves.

Figure 9:
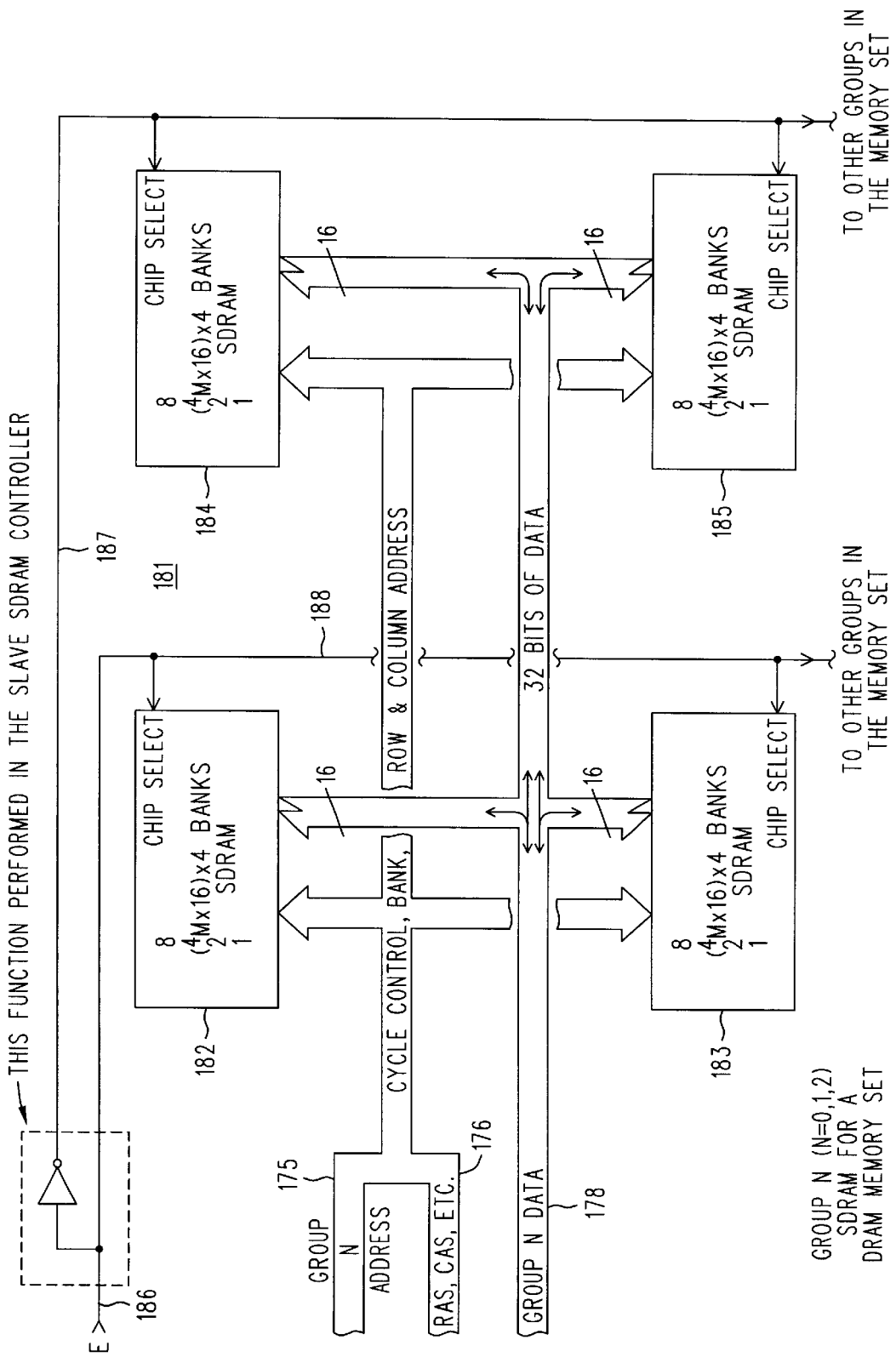
FIG. 9 is a simplified block diagram of a Group of SDRAM controlled by the Controllers of FIGS. 6 and 8.

Table III indicates various memory parts with which the ECR can be populated, and tells something of their expected organization. In particular, and with reference to the simplified Group SDRAM block diagram 181 of FIG. 9, note that these are parts (182–185) with sixteen data bits, so that to get a full width word (thirty-two bits) two parts will be addressed in tandem (182 & 183, 184 & 185), with their output bits conjoined into one large field 178. Note also that each part has four Banks, each of which implements a separate instance of the address space of the part (exploited during R100 and R33 operation). An alternative view is to construe the associated two Bank Select bits as further address bits, which is useful for L100 operation. It will be noted that there are two pairs of memory parts, with each pair selected by a common instance of a CHIP SELECT signal: signal 188 for parts 182 and 183, and signal 187 for parts 184 and 185. These CHIP SELECT signals function, from an addressing point of view, as if they were equivalent to row address bits. In this view, parts 182 and 184 combine to provide storage for half of the thirty-two bits of data, while parts 183 and 185 store the other half. So if the parts were 512Mbit parts, the arrangement shown is a 16M address at each of four banks by thirty-two bit data word memory. The E bit (of which there is one per address within a Memory Set) is turned into complementary CHIP SELECT signals (187, 188) that are common to each Group in the Memory Set. It will be noted that FIG. 9 deals with just one of three Groups in one of two DRAM Memory Sets.

Table IV is useful in appreciating relationships that may exist between the logic of the test program (focused on DUT architecture and internal organization) and the modes and configurations for the ECR and its Memory Sets. An important concept to bear in mind is that both the DUT and the ECR. can construe the same ordered sequence of bits as an address, even though they each have a very different internal organization and manner of operation. Thus, Table IV shows only two of a great many different possible DUT related interpretations of thirty-two ordered address bits. Tables IV–IX show ECR related interpretations of those same thirty-two address bits, and the two interpretations have very little to do with each other. At a very high level, the principal thing that the writer of a test program wants is the ability to have an address in the ECR that corresponds to the address applied to the DUT, with the knowledge that "he" (i.e., the memory tester under programmatic control) can write data to the ECR and later get it back again for analysis. On the one hand the test engineer searches for ways to capture meaning related to DUT architecture. On the other, the ECR addressing bits relate to its internal operation, regardless of any newfangled DUT. To suggest a simple example, there is no notion of a Z address in the ECR, so how can we arrange a way for an ECR Memory Set to have an address or range of addresses that correspond to a particular Z address or range of Z addresses in the DUT? For now, we ignore this tension, with the admonishment to please assume that the Address Classifiers and Data Classifiers simply pass their contents through unaltered, and that so long as the ECR is placed into an appropriate mode of operation (sufficient speed, enough addresses), any address good enough for the DUT is also good enough for the ECR. (True, to think that way permanently is to miss a trick. But for now we are interested in other topics, and will, for brevity, think that way, at least temporarily.)

Table V shows how 512M SDRAM parts are addressed when they are configured as part of a single Memory Set. Consider the case where the word width is a full thirty-two bits (bottom row of the table). This can happen under two different modes of operation: R100 (the full disaster of random addressing at 100 MHz using multiplexing and interleaving) and R33 (33 MHz random addressing with interleaving but without multiplexing). In each case the native address space of 8M is provided by the thirteen R's and the ten C's. That becomes 16M of address space (at each of four Banks) when the chip enable bit E is included. In the R100 no separate user initiated Group addressing (the G bits) are used: the Master DRAM Controller's State Machine simply directs the next memory transaction to the next Group's bus, without need of any addressing bits that correspond to the Group. This follows directly from each Group having its own bus; addresses on one bus are in a totally separate instance of an address space from those on another bus. Hence the footnote in Table V.

But suppose the mode of operation is R33. Now there is no multiplexing, although we can still direct (simultaneously!) randomly addressed memory transactions to each of the three Groups, albeit at the lower rate of 33 MHz. If we now equip each Group with Group addressing bits (the G's) we can stack the three Groups to form a combined address space that is three times the depth (48M of addressability). In this mode only the addressed Group will respond to the memory transaction. It is for this reason (among others) that the Slave SDRAM Controller's State Machine (161) is coupled to the GROUP N ADDRESS: that Slave SDRAM Controller may or may not be for the addressed Group.

The addressing scheme shown in Table V also supports the Narrow Word configurations. Again, it is a case of supplying additional addressability to account for the subdivision into small fields within. the full word. These are the F bits, which range from none (full thirty-two bit word) to five (thirty-two one-bit fields). To implement this mode of operation is another reason why the State Machine 161 of the Slave SDRAM Controller receives the GROUP N ADDRESS. It is also a reason why MUX 163 and data path 179 (see FIG. 8) are provided. It will be appreciated that the F bits do not go to the DRAM parts themselves; they get addressed as if for a full thirty-two bit word. It is the Slave SDRAM Controller that provides this additional Narrow Word capability, and the F bits disappear at the SDRAM controller, to be replaced by the appropriate Controller behavior.

Table VI is similar to Table V. Whereas Table V dealt with Groups that may or may not be stacked, Table VI deals with Memory Sets that are stacked. It uses the 512M part as an example; cut-down versions of Table VI exist for the smaller memory parts (as do cut-down versions of Table V, too). These other tables have been omitted for the sake of brevity. To stack two Memory Sets we need to have them configured each the same as the other, and provide one extra bit (the M bit) to double the address space, so that it matches two Memory Sets instead of just one. Who controls this extra bit is the test program. Who responds to it is the Master DRAM Controller (which is why its State Machine 193 of FIG. 6 is coupled to the ADDRESS 132). The M bit disappears as an addressing bit at that point, to be replaced by the presence or absence of memory activity, depending upon if the Memory Set having that instance of State Machine 193 is the addressed Memory Set.

Now consider Tables VII and VIII. They are essentially derivable from what has been discussed to this point. That is, the top line of Table VII is the same as the top line of Table V, and the top line of Table VIII is the same as the bottom line of Table V. The difference is that the vertical axes of Tables VI and VII are part size, while the vertical axis of Table IV is Narrow Word Mode.

Tables IX and X deal with the L100 configuration. Recall that this is the "linear" or Locality mode of addressing (minimal changes in row address). Here there is no multiplexing, and no interleaving. Where we used to have twelve separate instances of an address space we now have one, but it is twelve times as deep. This raises the need for four more address bits to apply to the Master DRAM and Slave SDRAM Memory Controllers. Those extra bits are GG and BB bits shown in both tables. As before, these bits disappear into the Controllers, as it were, to be replaced by the corresponding functionality, all made possible by smart State Machines and separate busses for the collections of memory that are the Groups. The difference between the two tables is the M bit, which operates as previously described in connection with Table VI. Note also that L100 operation excludes the notion of the Narrow Word mode: there are not enough address bits at the system level to support it.

A few words are in order about the State Machines in the Memory Controllers. First consider the State Machine 193 in the Master DRAM Controller 109. Its principal concerns are these: (A) If the mode of Memory Set operation is R100 then multiplexing among the Groups is required. It knows which Group is "next" in the round robin sequence of Groups, and conducts the memory transaction on the collection of busses (GROUP N ADDRESS, WRITE DATA, CYCLE CONTROL & READ DATA, N=0, 1, 2) for that next Group. (B) If the mode of Memory Set operation is other than R100 then multiplexing is not in use. In such a case the Group to use will be determined by incoming address bits, as described above in connection with Tables V–X, and the memory transaction is conducted on the collection of busses (ADDRESS, WRITE DATA, CYCLE CONTROL & READ DATA) as selected by the Group address. Now, cases (A) and (B) can not safely be assumed to always be write operations, even though it is readily appreciated that for R100 and R33 operation, there is no guarantee whatsoever that a read operation to an address will produce the last data that was written to that address. (It is to deal with this that the COMPOSE operation was devised.) Nevertheless, read operations are possible; suppose the memory has been composed. Then there is no problem. Also, case (B) merely says "NOT R100" and may obtain during L100 operation. Here again, there is no multiplexing, and since there is no interleaving either, read operations can indeed be expected to behave predictably.

However, one must not assume that cases (A) and (B) are the only cases. There is also a case (C) of composition. A COMPOSE operation produces its own special activity, depending upon whether R100 or R33 is in effect (L100 writes do not occasion the need for composition prior to reads). In the R100 case there need to be four consecutive reads to the same address (to provoke the interleaving to step through all the Banks). These four reads are performed simultaneously on each Group. Then there need to be four write operations (done on each Group simultaneously) to get the composed result back into all twelve Banks. All this activity can be the result of a single command, although it will not proceed at a 100 MHz rate per address. (This is because there is no way (with the SDRAM parts we use) to simultaneously write to all four Banks in one Group.) Composition is also possible in the R33 mode of operation. The difference is minor, in that the two non-addressed Groups need to be "shut down" during the four reads and writes needed to step through the interleaving. During the reads the two non-addressed ones of the GROUP N READ DATA BUSSES 134, 135 and 136 need to have all ones present while the addressed one performs as usual. This will produce the appropriate result in the COMPOSER 146, which is then written back into the Group that was composed. Only the four Banks of the Group are to be written to, as the corresponding addresses in the other Groups are really quite different locations in the address space in use (stacked Groups). Composing across Groups in R33 would be like adding account numbers for different credit cards; the result is not a useful account number! The State Machine in the Master DRAM Controller can arrange all this by determining which Groups get GROUP CYCLE CONTROL information over their associated busses. It is also assumed that the GROUP N READ DATA busses will present ones when inactive, or that they can be otherwise made to go high. If that is not the case then additional control over the inputs to the AND gates 151 through 154 will be needed to mask out the bits from Groups that are not to participate in the composition.

Now consider the State Machine 161 of the Slave SDRAM Controller of FIG. 8. Here are the principal things that it must tend to. First, it maintains a refresh timer. When the timer gets down to zero it issues a refresh cycle to the SDRAM it controls. During this time any incoming memory transactions must be held off in the pipeline. All the columns in a specific row are refreshed by the issued refresh cycle. The State Machine 161 knows which row to do next. If no refresh operation is in progress, then regular memory transactions can be performed. If interleaving is in effect (R100 or R33), then the transaction is conducted at the next Bank. If interleaving is not in effect then the transaction is conducted at the addressed Bank. In either case it is the task of the State Machine to manage the sending of the correct sequence of memory cycle control signals (176). That includes all manner of interleaving for different circumstances.

The interleaving performed by the Slave SDRAM Controller will be readily understood by those skilled in the art of SDRAM use. We now present Tables XI–XV, which constitute a condensed version of the correspondence between some of the various memory transactions of interest and their associated interleaving schemes.

TABLE XI

DEFINITIONS a = activate row (& row address)
r = read (& column address)
w = write (& column address)
p = precharge (& bank select)
— = clock cycle
Bn = traffic for bank # on AC or D
D = (separate) data bus;
i = (input) write data, o = (output) read data
AC = (separate) address & control bus

TABLE XII

SDRAM CONTROL

| | OPERATIONS | | | |
|---|---|---|---|---|
| SDRAM PINS | p | a | r | w |
| Row Address Select (RAS) | 1 | 1 | 0 | 0 |
| Column Address Select (CAS) | 1 | 0 | 1 | 1 |
| Write/Read | 0 | 0 | 0 | 1 |

TABLE XIII

OVERLAY WRITE AND OVERWIRTE WRITE

| | |
|---|---|
| B0 | p----a----r--o-wp----a----r--o-w |
| B1 | p----a----r--o-wp----a----r--o-w |
| B2 | p----a----r--o-wp----a----r--o-w |
| B3 | p----a----r--o-wp----a----r--o-w |
| D | o-i-o-i-o-i-o-i-o-i-o-i-o-i-o-i |
| AC | p---pa---par-parwparwparwparwparw-arw--rw---- |

16 cycles for one OLW within a Group

TABLE XIV

ANALYSIS READ OR BUFFER MEMORY READ

| | |
|---|---|
| B0 | p---a---r--op---a---r--o |
| B1 | p---a---r--op---a---r--o |
| B2 | p---a---r--op---a---r--o |
| B3 | p---a---r--op---a---r--o |
| D | o--o--o--o--o--o--o--o |
| AC | p--pa-pa-parparparparpar-ar--r--- |

12 cycles for an ANR or BMR within a Group

TABLE XV

FAST COMPOSE

| | |
|---|---|
| B0 | p--a------r--o----w---r--o----w---r--o----w |
| B1 | p--a------r--o----w---r--o----w---r--o----w |
| B2 | p--a---r--o----w---r--o----w---r--o----w |
| B3 | p--a---r--o----w---r--o----w---r--o----w |
| D | -------------oooo-iiii---oooo-iiii---oooo-iiii--- |
| C | p-papap-arrrr----wwwwrrrr----wwwwrrrr----wwww |

12 cycles to compose R33 data at 4 Banks for 1 address in 1 Group or for R100 data at 12 Banks for 1 address in 3 Groups (d to d, r to r, etc.)

Those familiar with SDRAM will recognize that the contents of Tables XI and XII are conventional. In a nutshell, these SDRAM parts have a data bus (D) that is separate from the address/control bus (AC). The precharge includes Bank selection. The fundamental operational cycle is p (precharge), a (select row) and then either r (read) or w (write), both of which include a column selection, followed by data (i or o) on D. In the format selected for Tables XIII through XV the lines, labeled B0–B3 are not separate collections of electrical signals. Anything shown on these lines of the Tables actually happens on the data bus (D) or on the address/control bus (C). We show it as we have to separate signal traffic for clarity while at the same time keeping such traffic in alignment as to time and also avoiding a cumbersome use of subscripts.

Table XIII shows the interleaving scheme used for the Overlay Write (OLW) and Overwrite Write (OWW) operations. It is a fairly straightforward application of the notion of interleaving, and can be seen to require 16 clock cycles to perform an OLW for four Banks within one Group. Another OLW could be happening simultaneously in another Group, however.

Table XIV shows the interleaving scheme used for either an Analysis Read (ANR) or a Buffer Memory Read (BMR). It requires twelve clock cycles to perform an ANR or BMR for four Banks within one Group. Of course, the same operation could also be occurring simultaneously in other Groups.

We now consider some further aspects of the compose operation. The test program could compose the results at a single address. This would be done with an ANR, and would require twelve clock cycles whether done for R33 data or R100 data. Those twelve clock cycles do not, however, get the composed data stored anywhere. To accomplish that would require extra time. Now, if the composed data were needed for only one pass and did not need to be retained, or, consecutive addresses to be composed are to be accessed randomly, then ANR is what must be used. To store the composed results each ANR could be followed with an OLW, at a price of twenty-eight clock cycles per addresses. This allows subsequent high speed accesses if the composed data is written back into all Banks that it was composed from. It is not so much that this does not work (it does), but to leave it at that is to miss a chance to get the same composed results considerably quicker (in as little as twelve cycles per address) when a consecutive range of addresses is to be composed. This high speed compose is performed with an operation termed Fast Compose (FCP). In the programming environment FCP is an instruction that is accompanied by parameters that indicate the Memory Set and address range therein that is to be composed.

The interleaving scheme for FCP is shown in Table XV. It also operates upon the four Banks within a Group, and may be performed simultaneously in different Groups for RI 00 data, or in a single Group for R33 data. In either case, FCP requires only twelve clock cycles per address, and includes a write operation, so that additional passes can be performed on the composed data. Those additional passes can be at high speed.

What makes FCP fast is, first, that it operates in the same manner as L100. That is, it takes advantage of locality, which is the ability to frequently avoid the need to issue another precharge (p) and another activate row (a), and simply alter the column selection during the subsequent r's and w's. Naturally, from time to time the Slave SDRAM Controller will need to issue another (p) and (a). The need to do this might arise either because the row selection did change with the next address, or because the time elapsed since the last activate row (a) requires it. But in the main, the vast majority of FCP's will occur in twelve clock cycles. Secondly, FCP is fast because it does both the read and the write using only one instance of addressing for each location in a Bank. This is a consequence of there being a single unified operation instead of two, each of which does its own addressing.

Figure 10:
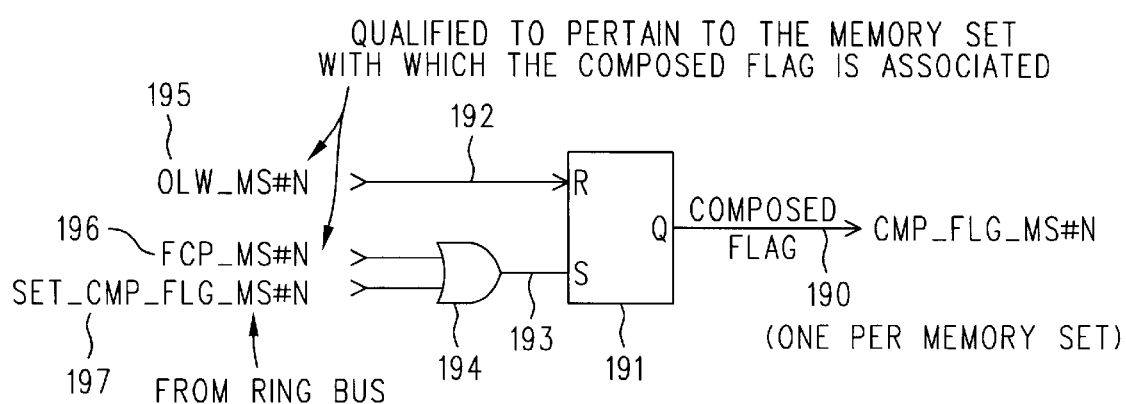
FIG. 10 is a simplified block diagram pertaining to the operation of a "COMPOSED" flag.

Finally, consider FIG. 10, which is a simplified block diagram 189 of how a COMPOSED flag (CMP_FLG_MS#N) 190 can be controlled. There is one such flag for each DRAM Memory Set, and it is used to indicate the composition integrity of a region of memory. The idea is that if the flag is set then it is safe to treat the associated region of memory as having been composed, and that it remains composed. A write operation to that region of memory will potentially (probably will) ruin the composition at the address written to, and is used to clear the flag. The flag itself arises from the state of a flip-flop or latch 191 that is set by a signal 193 that is the logical OR (produced by OR gate 194) of: (1) an explicit instruction 197 to set the latch (SET_CMP_FLG_MS#N) that can be issued over the Ring Bus; and, (2) a signal 196 (FCP_MS#N) indicating that an FCP operation for the associated Memory Set has been performed. Option (2) allows the test program to get the flag set even though FCP might not have been used to accomplish the composition. Any OLW done in the Memory Set (OLW_MS#N 195) is a potential threat to the integrity of the composed results, and is used to clear the flag. The state of the flag can be checked using the Ring Bus.

We claim:

1. A method of performing memory operations in DRAM for words of information associated with respective addresses within an address space, the method comprising the steps of:

(a) organizing (n×m)-many Banks of DRAM into n-many Groups of m-many Banks per Group, each Bank having an addressable location for each address in the address space;

(b) sequentially directing each next memory operation to the next Group in an ordered cyclical sequence thereof;

(c) within each Group, selecting each Bank therein in an ordered cyclical sequence;

(d) within each Group, and for consecutive memory operations directed by step (b) to that Group, sequentially interleaving those consecutive memory operations among the m-many Banks of the Group according to the ordered cyclical sequence of step (c); and (e) for each selected Bank within a Group, and for interleaved memory operations directed to those Banks by step (d), performing the next consecutive memory operation of step (d) at the address within the address space.

2. A method as in claim 1 wherein the memory operation is writing and further comprising the step of obtaining the information to be written from tests performed upon an addressable device under test.

3. A method as in claim 2 wherein the device under test is a memory and the bits within the word to be written represent channels within a memory test system, and further comprising the step of addressing addressable locations within the (n×m)-many Banks with addresses derived from addresses applied to the device under test.

4. A method as in claim 1 wherein the memory operation is reading and further comprising the steps of reading from an addressable location at a same address in all (n×m)-many Banks to produce (n×m)-many words, merging the (n×m)-many words into one final word, taking the final word as the result of the memory operation, and, writing the final word into all (n×m)-many Banks at that same address.

5. A method as in claim 4 further comprising the steps of setting a flag proximate the point in time when the final word is written into all (n×m)-many Banks and of clearing the flag upon a subsequent instance of step (b) in which the next consecutive memory operation is a write operation.

6. A method of performing memory operations in DRAM for words of information associated with respective addresses within an address space having a Group selection portion and a within-Bank address portion, the method comprising the steps of:

(a) organizing (n×m)-many Banks of DRAM into n-many Groups of m-many Banks per Group, each Group being selectable by the Group selection portion and each Bank within a Group having locations addressable by the within-Bank address portion;

(b) directing each next memory operation to the Group identified by the Group selection portion;

(c) within each Group, selecting each Bank therein in an ordered cyclical sequence;

(d) within each Group, and for consecutive memory operations directed by step (b) to that Group, sequentially interleaving those consecutive memory operations among the m-many Banks of the Group as each Bank is selected according to the ordered cyclical sequence of step (c); and (e) for each selected Bank within a Group, and for interleaved memory operations directed to those Banks by step (d), performing the next consecutive memory operation of step (d) at the location of the selected Bank by the within-Bank address portion.

7. A method as in claim 6 wherein the memory operation is writing and further comprising the step of obtaining the information to be written from tests performed upon an addressable device under test.

8. A method as in claim 7 wherein the device under test is a memory and the bits within the word to be written represent channels within a memory test system, and further comprising the step of addressing addressable locations within the n-many Groups of m-many Banks with addresses derived from addresses applied to the device under test.

9. A method as in claim 6 wherein the memory operation is reading and further comprising the steps of reading from an addressable location at a same address in all m-many Banks of the Group identified by the Group selection portion to produce m-many words, merging the m-many words into one final word, taking the final word as the result of the memory operation, and, writing the final word into all m-many Banks at that same address of the Group so identified.

10. A method as in claim 9 further comprising the steps of setting a flag proximate the point in time when the final word is written into all m-many Banks and of clearing the flag upon a subsequent instance of step (b) in which the next consecutive memory operation is a write operation.

* * * * *